(12) United States Patent
Quarmby et al.

(10) Patent No.: US 9,870,906 B1
(45) Date of Patent: Jan. 16, 2018

(54) MULTIPOLE PCB WITH SMALL ROBOTICALLY INSTALLED ROD SEGMENTS

(71) Applicants: Thermo Finnigan LLC, San Jose, CA (US); Thermo Fisher Scientific (Bremen) GmbH, Bremen (DE)

(72) Inventors: Scott T. Quarmby, Round Rock, TX (US); Jan-Peter Hauschild, Weyhe (DE); James M. Hitchcock, Pflugerville, TX (US)

(73) Assignees: Thermo Finnigan LLC, San Jose, CA (US); Thermo Fisher Scientific (Bremen) GmbH, Bremen (DE)

( * ) Notice: Subject to any disclaimer, the term of this patent is extended or adjusted under 35 U.S.C. 154(b) by 0 days.

(21) Appl. No.: 15/242,291

(22) Filed: Aug. 19, 2016

(51) Int. Cl.
*H01J 29/26* (2006.01)
*H01J 49/06* (2006.01)
*H01J 49/42* (2006.01)

(52) U.S. Cl.
CPC ........ *H01J 49/063* (2013.01); *H01J 49/4215* (2013.01); *H01J 49/4225* (2013.01)

(58) Field of Classification Search
CPC ........ H01J 49/00; H01J 49/0013; H01J 49/18; H01J 49/06; H01J 49/061; H01J 49/062; H01J 49/063; H01J 49/065; H01J 49/066

USPC .......................................... 250/281, 282, 283
See application file for complete search history.

(56) References Cited

U.S. PATENT DOCUMENTS

| | | | |
|---|---|---|---|
| 6,102,763 A | 8/2000 | Cueni et al. | |
| 6,316,768 B1 | 11/2001 | Rockwood et al. | |
| 2012/0298853 A1* | 11/2012 | Kurulugama | H01J 49/065 250/282 |
| 2013/0206973 A1* | 8/2013 | Kovtoun | H01J 49/063 250/282 |
| 2015/0021468 A1* | 1/2015 | Steiner | H01J 49/005 250/281 |
| 2015/0228467 A1* | 8/2015 | Grinfeld | H01J 49/0018 250/396 R |

FOREIGN PATENT DOCUMENTS

DE 102006011037 B4 6/2006

* cited by examiner

*Primary Examiner* — Nicole Ippolito
(74) *Attorney, Agent, or Firm* — David A. Schell

(57) ABSTRACT

A radio frequency multipole assembly includes first and second printed circuit boards. Each printed circuit board includes a substrate, at least two rows of conductive pads, and a plurality of tiles affixed to the conductive pads to form at least two radio frequency rods of a radio frequency multipole. The first and second printed circuit boards are arranged with the radio frequency rods towards each other and aligned to for the radio frequency multipole.

20 Claims, 15 Drawing Sheets

MULTIPOLE PCB WITH SMALL ROBOTICALLY INSTALLED ROD SEGMENTS

FIELD

The present disclosure generally relates to the field of mass spectrometry including multipole PCBs with small robotically installed rod segments.

INTRODUCTION

Multipoles are generally created using rods arranged around a central axis. They can be used as ion guides, quadrupole mass filters, collision cells, and ion traps. Alternating electric fields (RF potentials) can be applied to the rods to focus ions along a central axis of the multipole. To achieve a high degree of focusing, it is necessary to precisely machine and align the rods. Bent rods or improperly aligned rods can lead to asymmetries in the electric field that can cause desirable ions to be ejected from the multipole.

In addition to monolithic rods, segmented rods have been used for the creation of multipoles. However, this increases the number of elements that need to be machined and aligned. Good results for segmented rods have been achieved by machining a monolithic rod and then cutting the rod into segments, such that the segments of a rod are matched. This increases the number of machining steps required, and each rod segment needs to be individually aligned with the other segments of the same rod as well as to the rest of the multipole.

From the foregoing it will be appreciated that a need exists for improved manufacturing of multipoles.

SUMMARY

In a first aspect, a radio frequency multipole assembly can include first and second printed circuit boards. Each printed circuit board can include a substrate, at least two rows of conductive pads, and a plurality of tiles affixed to the conductive pads to form at least two radio frequency rods of a radio frequency multipole. The first and second printed circuit boards can be arranged with the radio frequency rods towards each other and aligned to form the radio frequency multipole.

In various embodiments of the first aspect, the radio frequency multipole can be an ion guide, a quadrupole mass filter, a collision cell, or an ion trap.

In various embodiments of the first aspect, each of the rows of conductive pads can be arranged in a straight line, an arc, a sigmoidal curve, or any combination thereof.

In various embodiments of the first aspect, the tiles can include a conductive metal substantially free of non-conductive oxides. In particular embodiments, the metal can include stainless steel, titanium, nickel, or any combination thereof.

In various embodiments of the first aspect, tiles can include a core of deformable material and a surface layer of conductive material. In particular embodiments, the tiles can be formed by cutting the core from an extrusion, by stamping the core, or any combination thereof. In particular embodiments, the deformable material can be an extrudable material such as a polymer, a deformable metal such as copper, brass, or aluminum, or any combination thereof. In particular embodiments, the tiles can be formed by plating the core with the surface layer of conductive material. In particular embodiments, the conductive material can include a metal substantially free of non-conductive oxides, such as gold or nickel.

In various embodiments of the first aspect, the tiles can have a trapezoidal cross section, a rectangular cross section, a cross section with a curved edge, or any combination thereof. In particular embodiments, the curved edge can include a hyperbolic curved edge, a quadrant arc edge, or an arcuate curved edge.

In various aspects of the first embodiments, a contact surface of the tiles for contacting the conductive pad can have a triangular shape or a quadrilateral shape. In particular embodiments, the quadrilateral shape can include a rectangular shape, a trapezoidal shape, or a parallelogram shape.

In various aspects of the first embodiments, the tiles can be substantially identical.

In various aspects of the first embodiments, each radio frequency rod of the radio frequency multipole assembly can include at least 2 tiles, at least 3 tiles, at least 5 tiles, such as at least 10 tiles, such as at least 15 tiles, even at least 20 tiles.

DRAWINGS

For a more complete understanding of the principles disclosed herein, and the advantages thereof, reference is now made to the following descriptions taken in conjunction with the accompanying drawings, in which.

FIGS. 4A, 4B, 4C, and 4D are diagrams illustrating the printed circuit board with tiles, in accordance with various embodiments.

Figure 5A:
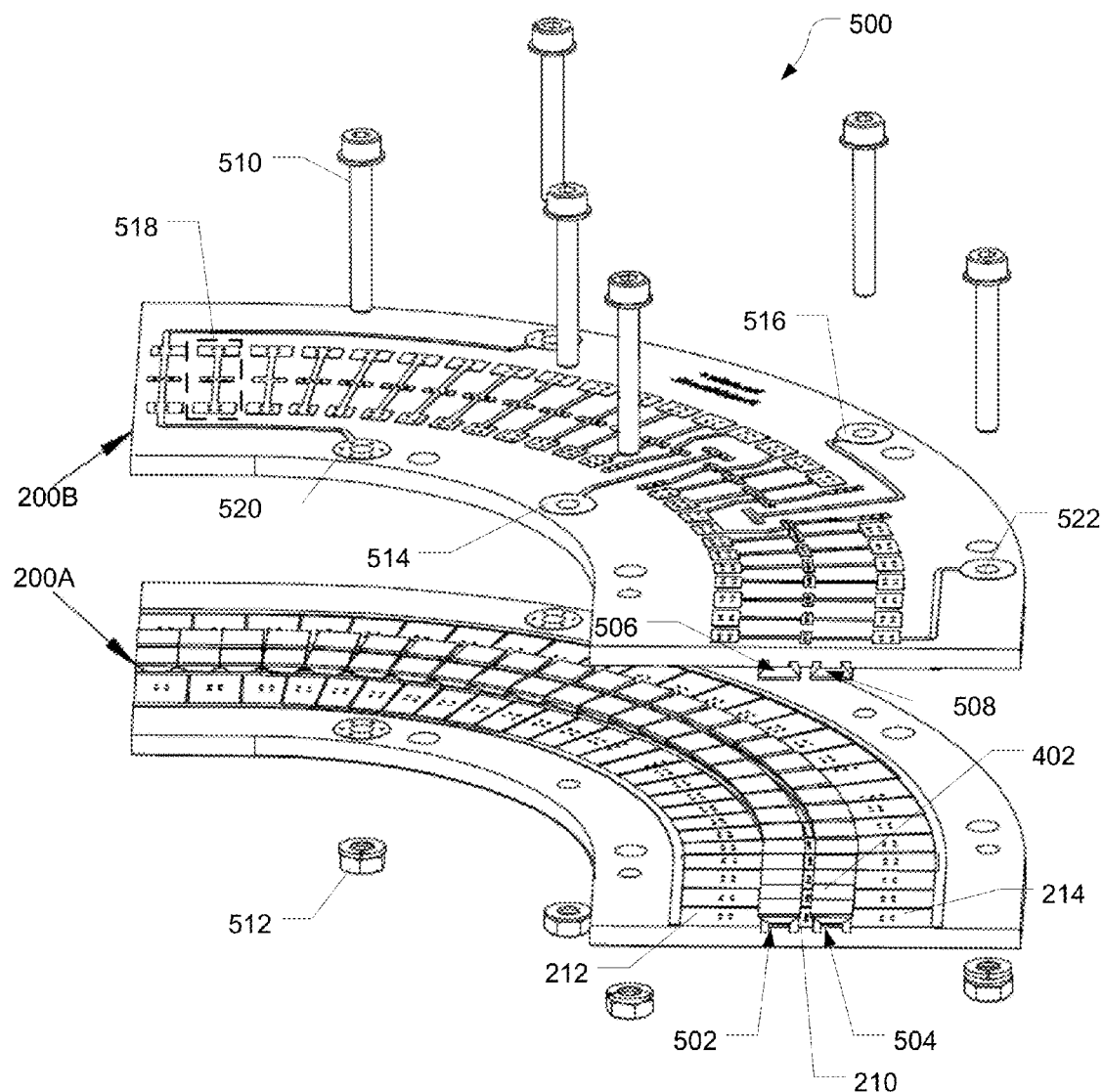
Figure 5B:
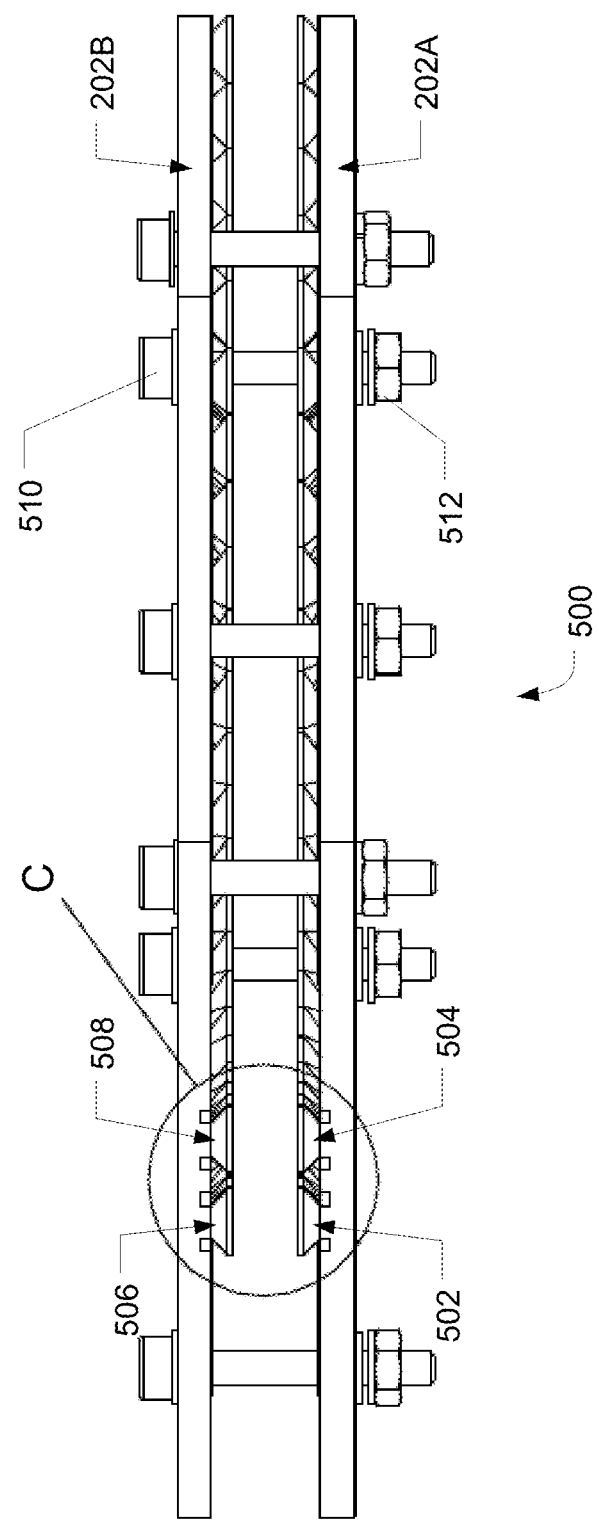
Figure 5C:
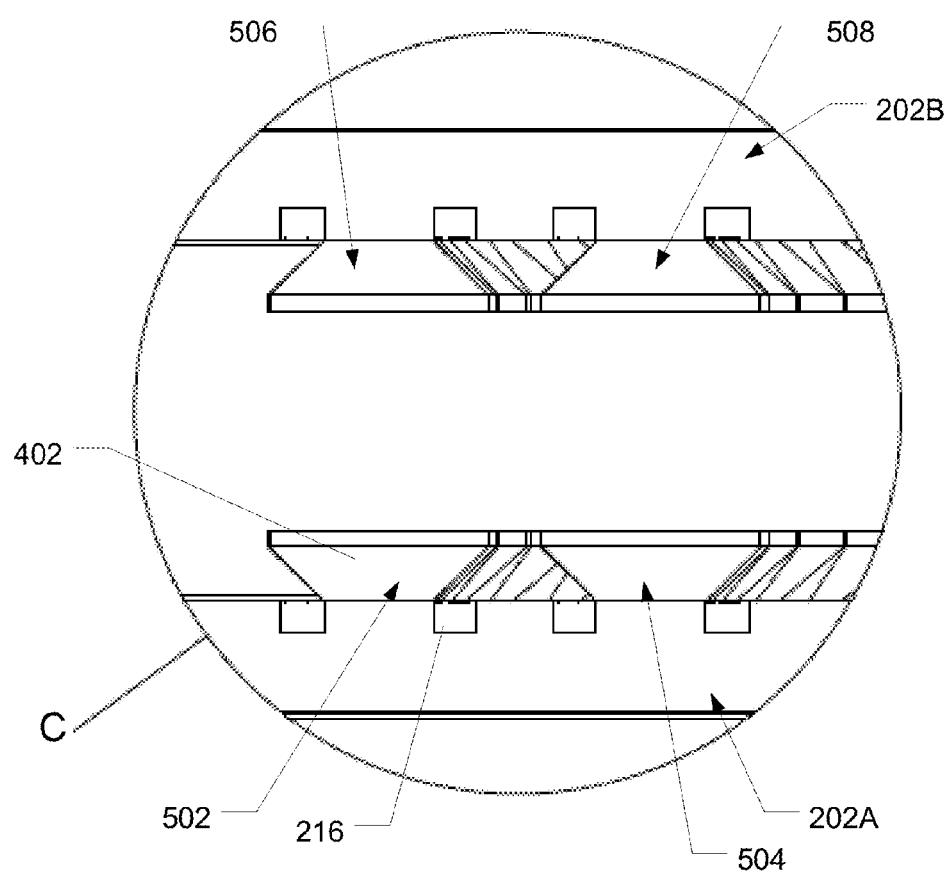

FIGS. 5A, 5B, and 5C are diagrams illustrating the two aligned printed circuit board with tiles, in accordance with various embodiments.

FIGS. 6A, 6B, 6C, and 6D are diagrams of exemplary tile cross sections, in accordance with various embodiments.

FIGS. 7A, 7B, 7C, and 7D are diagrams of an exemplary tile shapes, in accordance with various embodiments.

Figure 8:
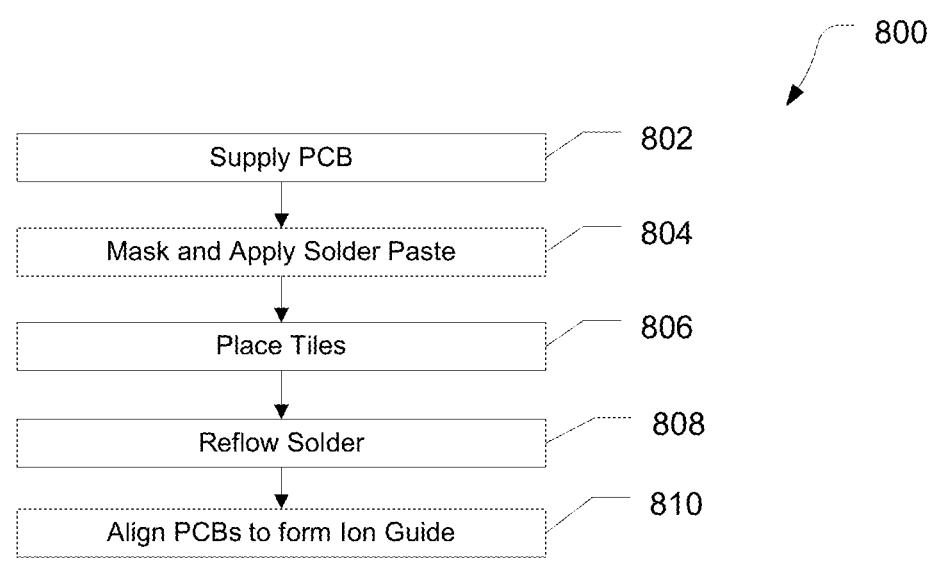

FIG. 8 is a flow diagram illustrating exemplary methods of forming a radio frequency multipole assembly, in accordance with various embodiments.

Figure 9:
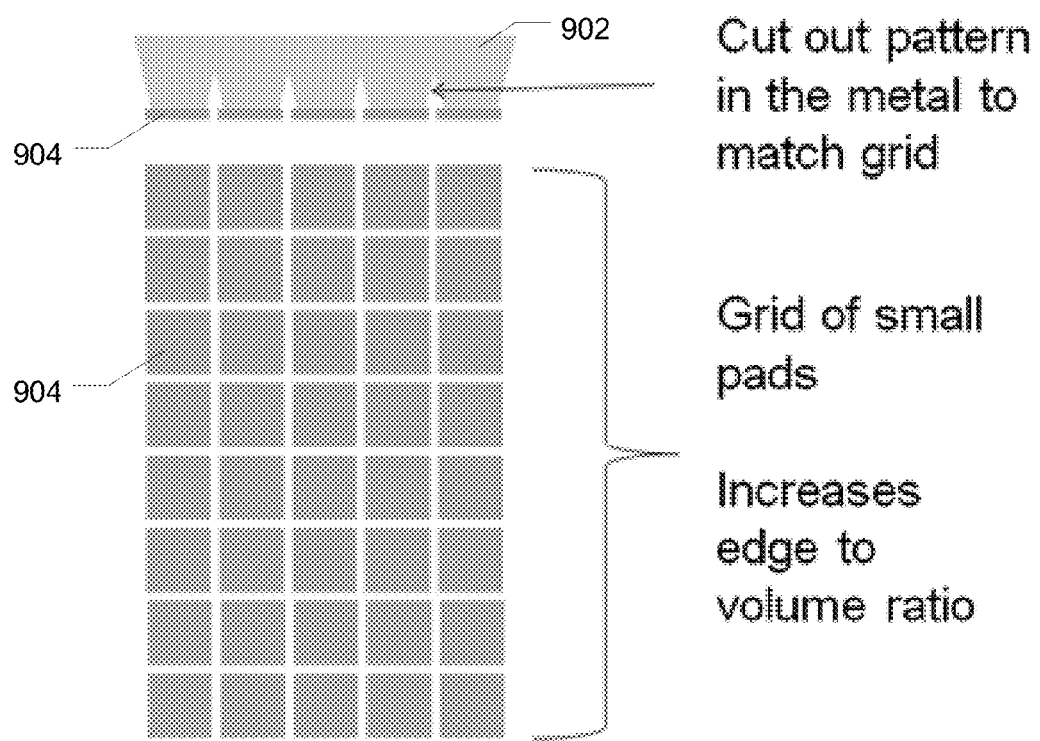

FIG. 9 is a diagram of exemplary grid pattern formed in the tile and the pads, in accordance with various embodiments.

It is to be understood that the figures are not necessarily drawn to scale, nor are the objects in the figures necessarily drawn to scale in relationship to one another. The figures are depictions that are intended to bring clarity and understanding to various embodiments of apparatuses, systems, and methods disclosed herein. Wherever possible, the same reference numbers will be used throughout the drawings to refer to the same or like parts. Moreover, it should be appreciated that the drawings are not intended to limit the scope of the present teachings in any way.

DESCRIPTION OF VARIOUS EMBODIMENTS

Embodiments of systems and methods for ion separation are described herein.

The section headings used herein are for organizational purposes only and are not to be construed as limiting the described subject matter in any way.

In this detailed description of the various embodiments, for purposes of explanation, numerous specific details are set forth to provide a thorough understanding of the embodiments disclosed. One skilled in the art will appreciate, however, that these various embodiments may be practiced with or without these specific details. In other instances, structures and devices are shown in block diagram form. Furthermore, one skilled in the art can readily appreciate that the specific sequences in which methods are presented and performed are illustrative and it is contemplated that the sequences can be varied and still remain within the spirit and scope of the various embodiments disclosed herein.

All literature and similar materials cited in this application, including but not limited to, patents, patent applications, articles, books, treatises, and internet web pages are expressly incorporated by reference in their entirety for any purpose. Unless described otherwise, all technical and scientific terms used herein have a meaning as is commonly understood by one of ordinary skill in the art to which the various embodiments described herein belongs.

It will be appreciated that there is an implied "about" prior to the temperatures, concentrations, times, pressures, flow rates, cross-sectional areas, etc. discussed in the present teachings, such that slight and insubstantial deviations are within the scope of the present teachings. In this application, the use of the singular includes the plural unless specifically stated otherwise. Also, the use of "comprise", "comprises", "comprising", "contain", "contains", "containing", "include", "includes", and "including" are not intended to be limiting. It is to be understood that both the foregoing general description and the following detailed description are exemplary and explanatory only and are not restrictive of the present teachings.

As used herein, "a" or "an" also may refer to "at least one" or "one or more." Also, the use of "or" is inclusive, such that the phrase "A or B" is true when "A" is true, "B" is true, or both "A" and "B" are true. Further, unless otherwise required by context, singular terms shall include pluralities and plural terms shall include the singular.

A "system" sets forth a set of components, real or abstract, comprising a whole where each component interacts with or is related to at least one other component within the whole.

Mass Spectrometry Platforms

Figure 1:
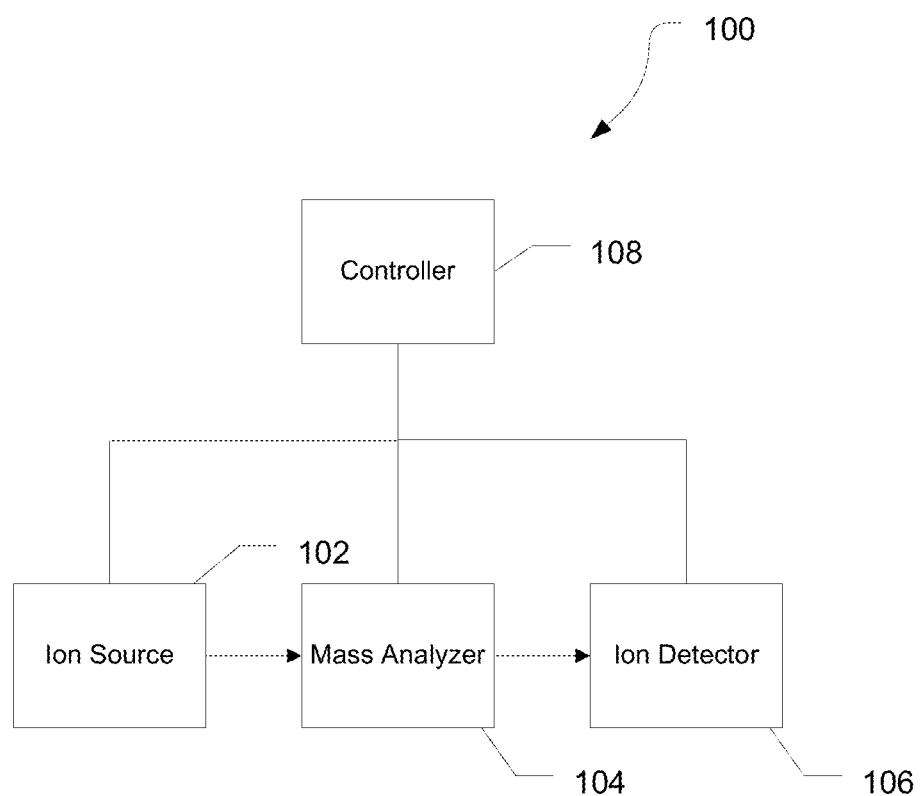
FIG. 1 is a block diagram of an exemplary mass spectrometry system, in accordance with various embodiments.

Various embodiments of mass spectrometry platform 100 can include components as displayed in the block diagram of FIG. 1. In various embodiments, elements of FIG. 1 can be incorporated into mass spectrometry platform 100. According to various embodiments, mass spectrometer 100 can include an ion source 102, a mass analyzer 104, an ion detector 106, and a controller 108.

In various embodiments, the ion source 102 generates a plurality of ions from a sample. The ion source can include, but is not limited to, a matrix assisted laser desorption/ionization (MALDI) source, electrospray ionization (ESI) source, atmospheric pressure chemical ionization (APCI) source, atmospheric pressure photoionization source (APPI), inductively coupled plasma (ICP) source, electron ionization source, chemical ionization source, photoionization source, glow discharge ionization source, thermospray ionization source, and the like.

In various embodiments, the mass analyzer 104 can separate ions based on a mass-to-charge ratio of the ions. For example, the mass analyzer 104 can include a quadrupole mass filter analyzer, a quadrupole ion trap analyzer, a time-of-flight (TOF) analyzer, an electrostatic trap mass analyzer (e.g., ORBITRAP mass analyzer), Fourier transform ion cyclotron resonance (FT-ICR) mass analyzer, and the like. In various embodiments, the mass analyzer 104 can also be configured to fragment the ions using collision induced dissociation (CID), electron transfer dissociation (ETD), negative electron transfer dissociation (nETD), proton transfer reaction (PTR), electron capture dissociation (ECD), photo induced dissociation (PID), surface induced dissociation (SID), and the like, and further separate the fragmented ions based on the mass-to-charge ratio.

In various embodiments, the ion detector 106 can detect ions. For example, the ion detector 106 can include an electron multiplier, a Faraday cup, and the like. Ions within or leaving the mass analyzer can be detected by the ion detector. In various embodiments, the ion detector can be quantitative, such that an accurate count of the ions can be determined.

In various embodiments, the system can include ion optics to guide and focus ions as they move from the ion source 102 to the mass analyzer 104. Additional ion optics may be utilized to guide or focus ions as they move from the mass analyzer 104 to the ion detector 106. The ion optics can include ion lenses, ion guides, and the like.

In various embodiments, the controller 108 can communicate with the ion source 102, the mass analyzer 104, and the ion detector 106. For example, the controller 108 can configure the ion source or enable/disable the ion source. Additionally, the controller 108 can configure the mass analyzer 104 to select a particular mass range to detect. Further, the controller 108 can adjust the sensitivity of the ion detector 106, such as by adjusting the gain. Additionally, the controller 108 can adjust the polarity of the ion detector 106 based on the polarity of the ions being detected. For example, the ion detector 106 can be configured to detect positive ions or be configured to detected negative ions.

Segmented Multipole Assembly

Figure 2A:
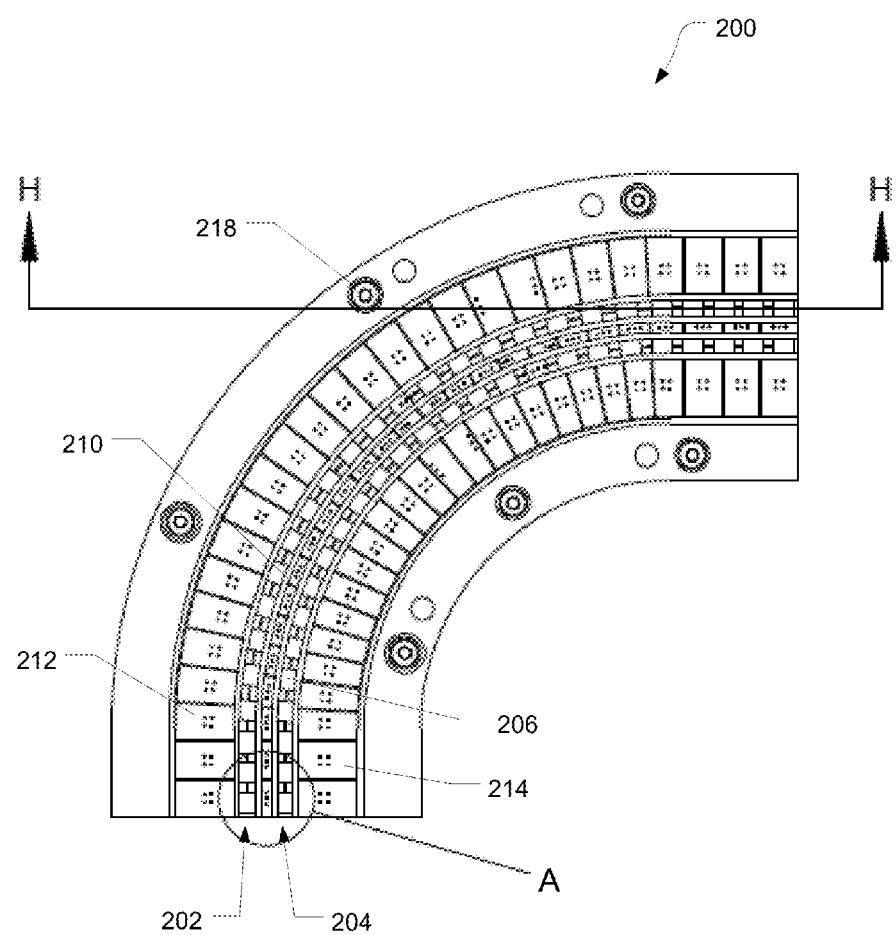
FIGS. 2A and 2B are diagrams illustrating a printed circuit board, in accordance with various embodiments.
Figure 2B:
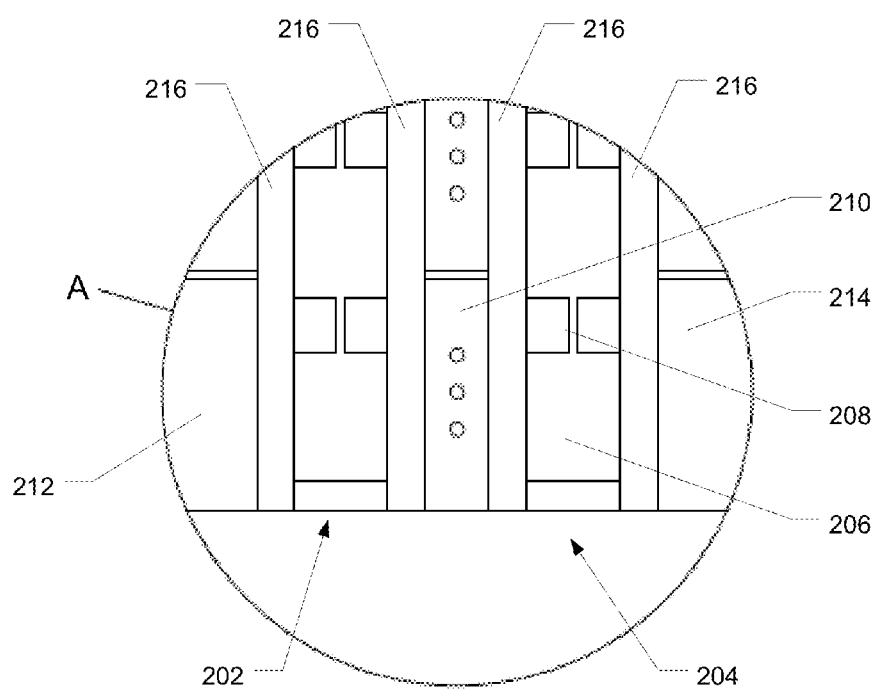

FIGS. 2A and 2B illustrate a PCB (printed circuit board) 200. FIG. 2B is a detail view of area A. PCB 200 can be PCB material, ceramic, glass, or the like. PCB 200 can include rod tracks 202 and 204, designating the placement and path of rods of a segmented multipole. A plurality of rod tile pads 206 can be positioned along rod tracks 202 and 204 corresponding to the location of each segment of the segmented multipole. Rod traces 208 can connect adjacent pairs of rod tile pads 206 along a rod track 202 or 204.

In various embodiments, a rod track, such as rod track 202 can include at least 5 rod tile pads, such as at least 10 rod tile pads, such as at least 15 rod tile pads, even at least 20 rod tile pads. In various embodiments, the rod tracks (or rows of conductive pads) can be arranged in a straight line, an arc, a sigmoidal curve, or any combination thereof.

Additionally, PCB 200 can include axial field pads 210 between rod tracks 202 and 204, and axial field pads 212 and 214 located outside of the pair of rod tracks 202 and 204. Cuts 216 can serve to separate rod tracks 202 and 204 from axial field pads 210 and axial field pads 212 and 214. PCB 200 can further include mounting holes, such as mounting hole 218.

Figure 3A:
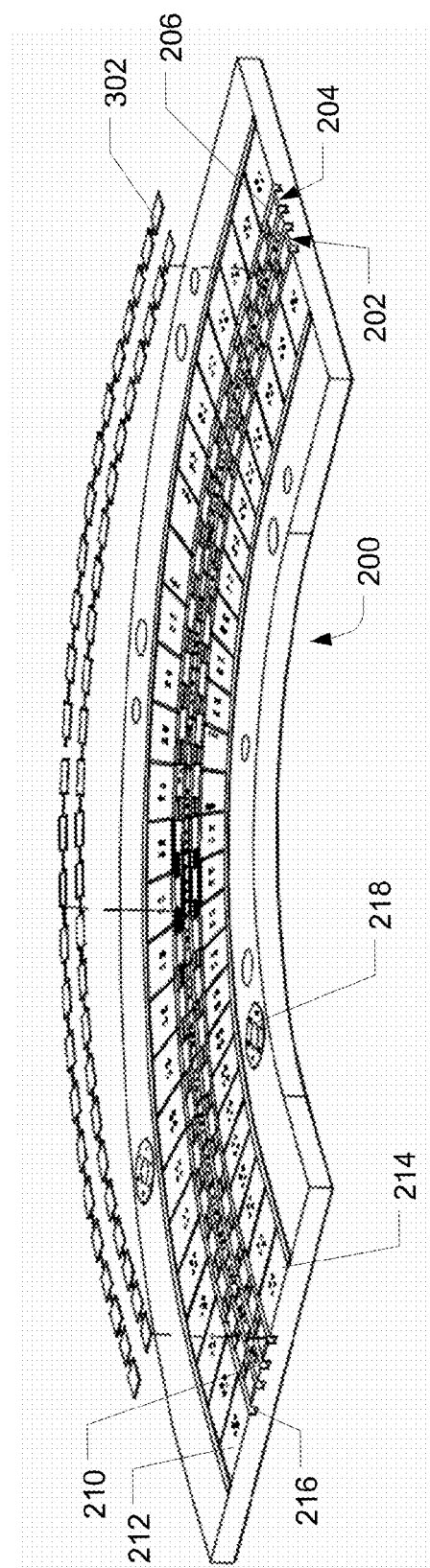
FIG. 3 is an expanded view diagram illustrating the application of solder paste to a printed circuit board, in accordance with various embodiments.

FIG. 3 illustrates the application of solder paste to the rod tile pads. FIG. 3 is an expanded view illustrating the PCB 200 as described with reference to FIGS. 2A and 2B and the solder paste 302 that can be applied over the rod tile pads 206. In various embodiments, the solder paste 302 can be applied to the rode tile pads 206 by applying a mask (not shown) to the PCB 200 exposing rod tile pads 206 while masking the rest of PCB 200. Solder paste can then be applied overtop the mask and the mask can be removed such that solder is only applied to the rode tile pads 206.

Figure 4A:
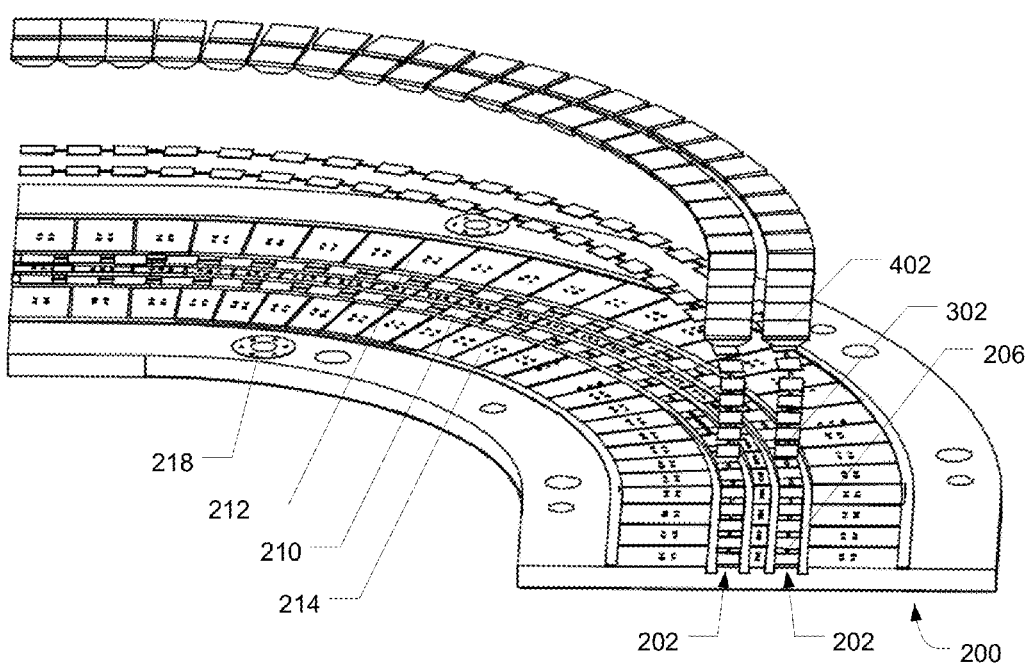

FIGS. 4A, 4B, 4C, and 4D illustrate the application of rod tiles to PCB 200. FIG. 4A is an expanded view illustrating PCB 200, solder paste 302, and rod tiles 402. The solder paste 302 is applied to the rod tile pads 206 as described with reference to FIG. 3, and the rod tiles 402 are positioned on the overlying the solder paste 302.

Figure 4B:
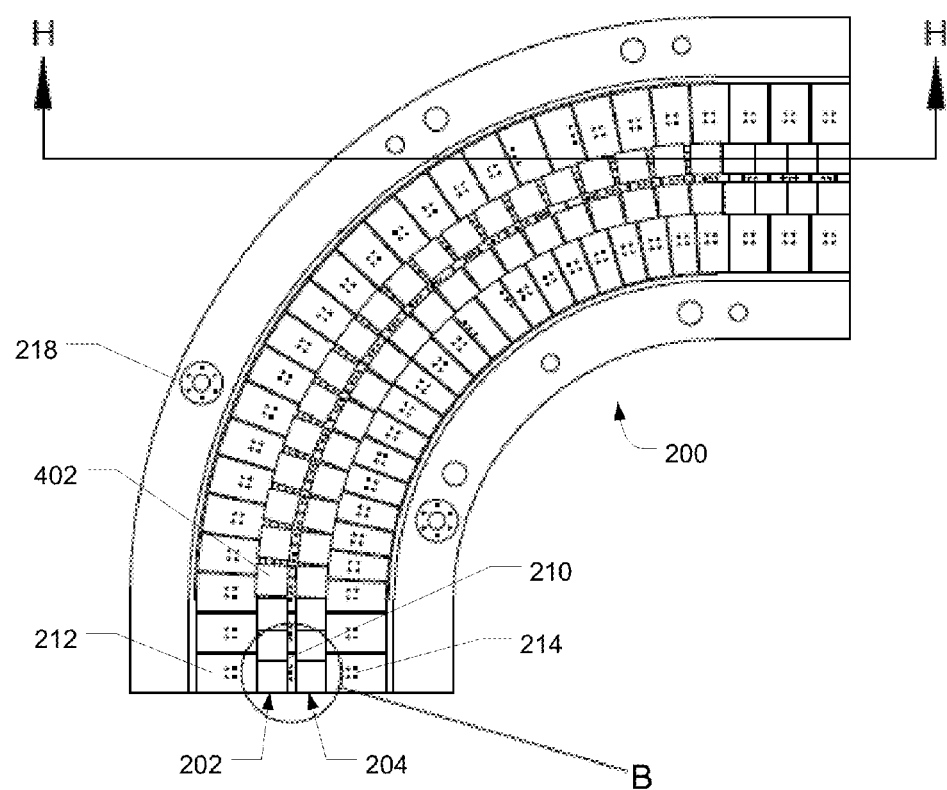
Figure 4C:
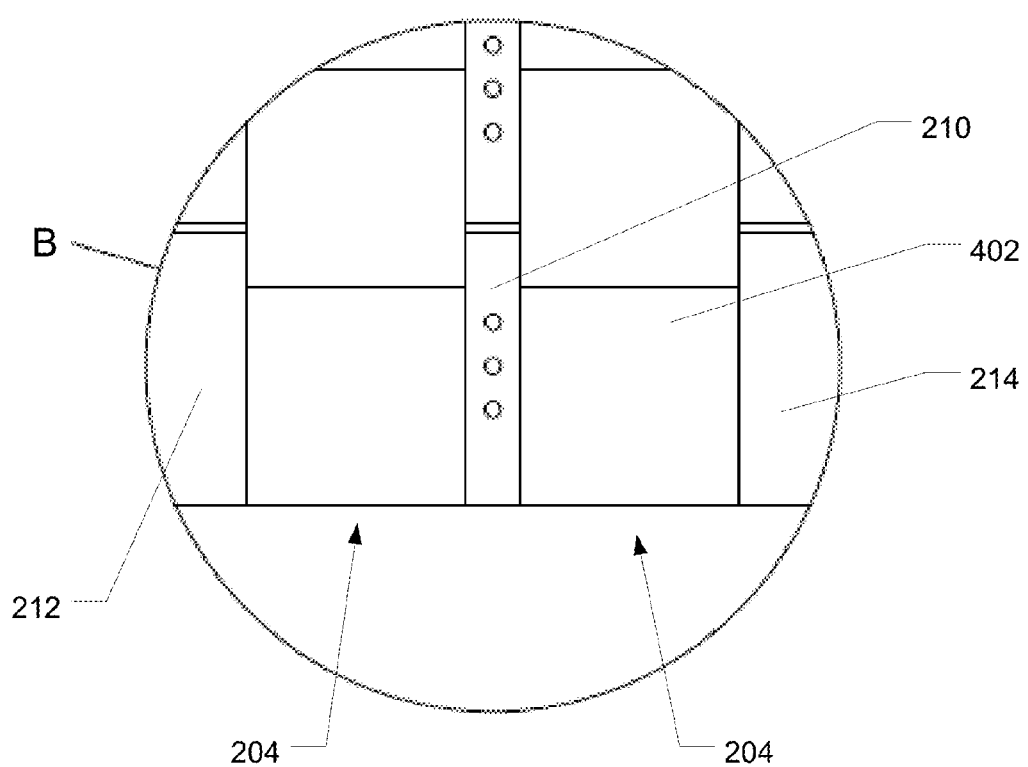
Figure 4D:
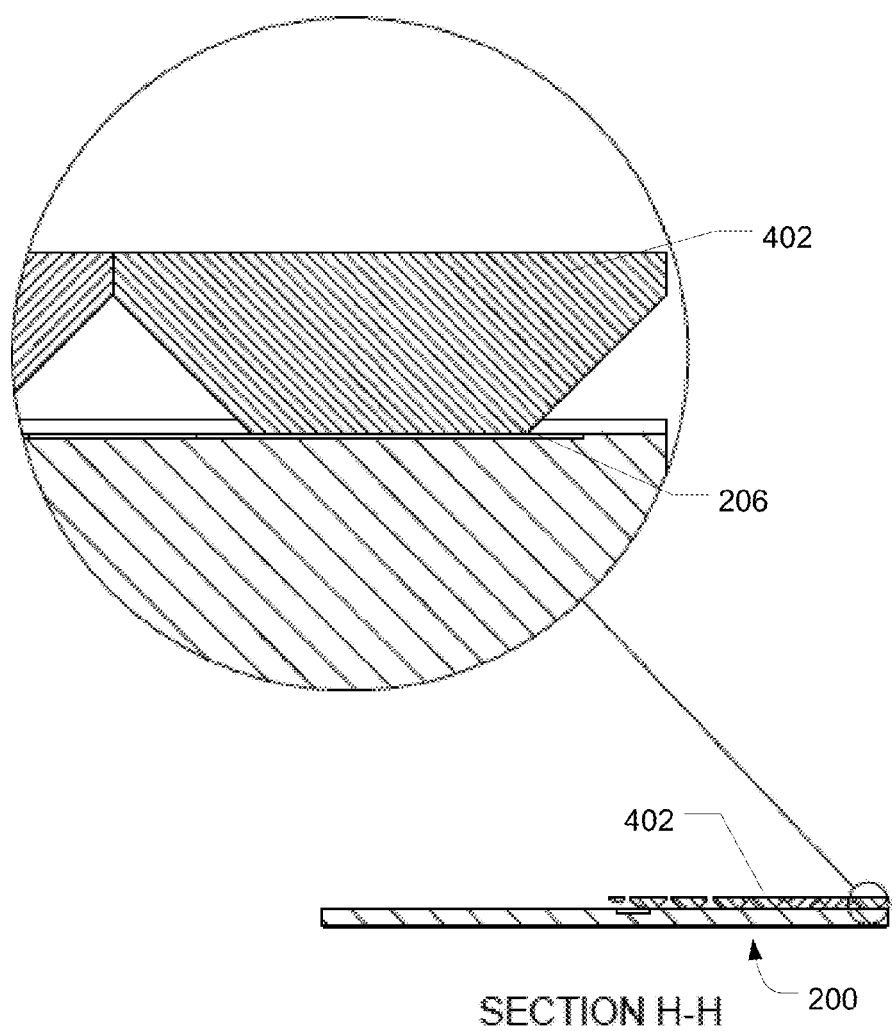

FIG. 4B is a top view of PCB 200 with the rod tiles 402 in place. FIG. 4C is a detail view of Area B of FIG. 4B. FIG. 4D is a cross section view along H-H in FIG. 4B. The rod tiles 402 can be positioned overtop the rod tile pads 206 and aligned with In various embodiments, the rod tiles 402 can be placed by a pick-and-place machine over the solder paste 302. The solder paste 302 can then be reflowed. During reflow, the small size of the rod tiles 402 can allow them to self-align on the rod tile pads 206.

In various embodiments, rod tiles can include a conductive metal substantially free of non-conductive oxides. The conductive metal can include stainless steel, titanium, nickel, or any combination thereof.

In various embodiments, rod tiles can include a core of deformable material and a surface layer of conductive material. The deformable material can be an extrudable material such as a polymer, a deformable metal, such as copper, brass, or aluminum, or a combination thereof. The conductive material can include a metal substantially free of non-conductive oxides, such as gold or nickel. Rod tile cores can be formed by cutting the core from an extrusion, by stamping the core, or any combination thereof. The cores can then be plated with a surface layer of conductive material.

In various embodiments, as shown in FIG. 9, rod tile 902 can have a grid pattern cut into their base corresponding to a grid pattern formed by a plurality of small pads 904. The grid pattern can improve the self-alignment of the tiles when reflowing the solder due to the increased edge to volume ratio. This can be particularly beneficial as tile size is increased.

FIGS. 5A, 5B, and 5C illustrate multipole assembly 500 including two PCBs 200A and 200B, similar to the PCB as described in FIGS. 2A through 4D. FIG. 5A is an expanded view. FIG. 5B illustrates multipole assembly 500 in an assembled state, while FIG. 5C is a detail view of Area C of FIG. 5B. PCB 200A can include rods 502 and rod 504 each comprised of a plurality of rod tiles 402. Additionally, PCB 200B can include rods 506 and 508, each similarly comprised of a plurality of rod tiles. Rods 502 and 504 can be aligned with one another by virtue of the placement of the rods tile pads and the self-alignment of the rod tiles 402. Similarly, rods 506 and 508 can be aligned with one another. PCBs 200A and 200B can then be aligned with one another and held in place by bolts 510 and nuts 512. Alternatively, PCBs 200A and 200B can be held in place by sheet metal, machined metal pieces, or the like.

In various embodiments, the multipole assembly 500 can be an ion guide, a quadrupole mass filter, a collision cell, or an ion trap.

FIG. 5A additionally illustrates the backside traces on PCB 200B. In various embodiments, electrical connection 514 can be electrically coupled with rod 508 and electrical connection 516 can be electrically coupled with rod 506 by vias passing through PCB 200B. Additionally, rod 502 can be electrically coupled to rod 508 using one of bolts 510 to conductively couple electrical connection 514 with a corresponding electrical connection on PCB 200A. Similarly, rod 504 can be electrically coupled to rod 506 using one of bolts 510 to conductively couple electrical connection 516 with a corresponding electrical connection on PCB 200A. Alternatively, bolts 510 may not be used in the conductive path to electrically couple elements of PCB 200A with elements of 200B and other electrical connections can be made, such as by connecting PCBs 200A and 200B together with one or more wires or independently connecting each of PCB 200A and 200B to a voltage source. In operation, RF potentials can be applied to the rods by way of electrical connections 514 and 516, such that rods 502 and 508 have the same RF potential and rods 504 and 506 have the same RF potential. In alternate embodiments, each of rods 502, 504, 506, and 508 can be electrically isolated from one another, enabling RF potentials and or DC potentials to be applied to the rods individually. In other embodiments, the rod segments of a rod can be electrically isolated from one another, allowing for different RF and DC potentials to be applied to each segment, or the rod segments can be connected in a resistive network enabling the application of a DC gradient along the rods themselves.

A plurality of pad sets 512 can each including an axial field pad 210 and axial field pads 212 and 204 and can be arranged along the length of the multipole assembly. Axial field pads 210 and axial field pads 212 and 214 can be connected to corresponding circuit traces on the backside of PCB 200B through a plurality of vias, illustrated as multiple holes in each pad. The pad sets 512 can be connected via a resistor network created by placing resistors bridging the gap between each adjacent pair of pad sets 512. Electrical connections 520 and 522 can be used to connect the ends of the resistive network to two different electrical potentials thereby providing a potential gradient along the length of multipole. Additionally, the resistor network on PCB 200B can be electrically connected to a corresponding resistor network on PCB 200A by using conductive bolts 510 through connections 520 and 522 and corresponding connections on PCB 200A.

In various embodiments, an array of alignment pins can be used to align PCBs 200A and 200B. For example, alignment pins can be positioned at axial field pads 212 and 214 on PCB 200A and corresponding holes can be positioned at corresponding axial field pads on PCB 200B. In addition to acting as alignment pins, the pins can serve as electrical connectors between corresponding axial filed pads on PCB 200A and PCB 200B and may reduce the number of resistors and traces needed to couple the axial field pads. Alternatively, alignment pins can be located in non-function portions of the PCBs and may not provide electrical connectivity between PCB 200A and PCB 200B.

Figure 6A:
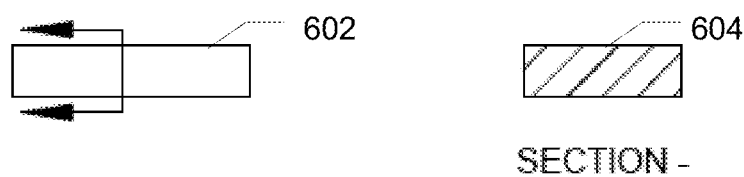

FIG. 6A illustrates an exemplary rod tile with a rectangular cross section. View 602 is of the base of the rod tile and view 604 is the rod tile in cross section.

Figure 6B:
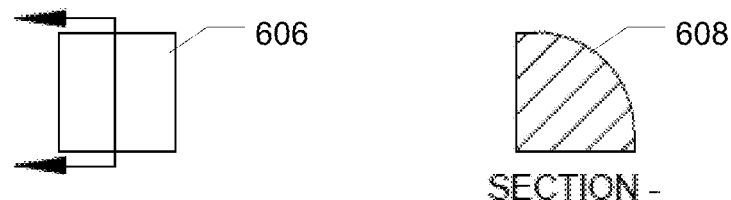

FIG. 6B illustrates an exemplary rod tile with a curved cross section, such as a arcuate cross section, even a quadrant arc cross section. When arranged in a multipole, the curved face is positioned towards the center of the multipole where the ion path is located. View 606 is of the base of the rod tile and view 608 is the rod tile in cross section.

Figure 6C:

FIG. 6C illustrates an exemplary rod tile with a curved cross section, such as a hyperbolic curve cross section. When four rods having a hyperbolic curve cross section are arranged with the curves facing one another, the cross section of the multipole is a hyperbola. View 610 is of the base of the rod tile and view 612 is the rod tile in cross section.

Figure 6D:

FIG. 6D illustrates an exemplary rod tile with a trapezoidal cross section. In various embodiments, the rod tile can have a trapezoidal cross section in one or more orthogonal dimensions. View 614 is of the base of the rod tile and view 616 is the rod tile in cross section. In various embodiments, the trapezoidal cross section extends the upper surface of the rod tiles out beyond the rod tile pads, obscuring a larger portion of the PCB from the perspective of ions in the flight path. Since the axial field pads are separated from the rod pads by the cuts (in part to ensure the rods are not in electrical contact with the axial field pads), the trapezoidal cross section reduces the chance the ejected ions impact exposed PCB.

Figure 7A:

FIG. 7A illustrates an exemplary rod tile with a triangular base or contact surface for contacting the rod tile pads. View 702 is of the base of the rod tile and view 704 is a 3D view of the rod tile. The triangular base enables close packing of the rod tiles around a curve when positioned such that the apex is towards the center of the curvature. Alternatively, a straight rod path can be constructed by alternating the triangular-based rod tiles such that adjacent rod tiles have the apex in opposite directions. In various embodiments, triangular-based rod tiles having different apex angles can be used together to construct various rod paths.

Figure 7B:
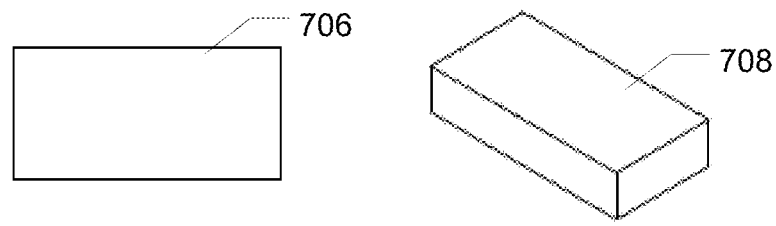

FIG. 7B illustrates an exemplary rod tile with a rectangular base or contact surface for contacting the rod tile pads. View 706 is of the base of the rod tile and view 708 is a 3D view the rod tile.

Figure 7C:

FIG. 7C illustrates an exemplary rod tile with a trapezoidal base or contact surface for contacting the rod tile pads. View 710 is of the base of the rod tile and view 712 is a 3D view the rod tile. The trapezoidal base enables close packing of the rod tiles around a curve when positioned such that the shorter side is towards the center of the curvature. Alternatively, a straight rod path can be constructed by alternating the trapezoidal-based rod tiles such that adjacent rod tiles have the apex in opposite directions. In various embodiments, trapezoidal-based rod tiles having different apex angles can be used together to construct various rod paths.

Figure 7D:
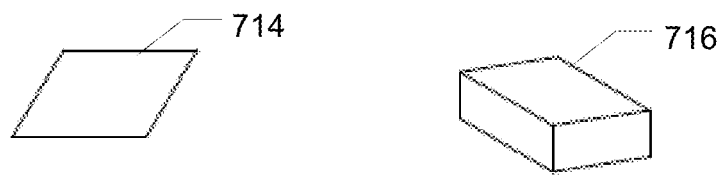

FIG. 7D illustrates an exemplary rod tile with a parallelogram base or contact surface for contacting the rod tile pads. View 714 is of the base of the rod tile and view 716 is a 3D view the rod tile.

In various embodiments, the base shapes described in FIGS. 7A-7D can be combined with the cross sectional shapes described in FIGS. 6A-6D in various ways. For example, a trapezoidal cross section can be combined with any of the described base shapes, such that an upper surface of the tile is similarly shaped by larger than the base and the sides of the tile are all angled. Alternatively, a rectangular cross section can be combined with any of the described base shapes such that an upper surface of the tile is substantially similarly the base and the sides of the tile are substantially vertical. Other combinations of cross sections and base shapes are also possible.

In various embodiments, the multipole rods can be assembled from one or more rod tiles of different sizes and shapes. For example, curves can be constructed from triangular-based and trapezoidal-based rod tiles while straight sections can be constructed from rectangular-based and parallelogram-based rod tiles. In other embodiments, the multipole rods can be assembled from a plurality of substantially identical rod tiles.

FIG. 8 is a flow diagram illustrating a method 800 of assembling a segmented multipole. The segmented multipole can be an ion guide, a quadrupole mass filter, a collision cell, or an ion trap. The segmented multipole can include four, six, or eight or more segmented rods and can be assembled from two or more PCBs, each having a subset of the segmented rods.

At 802, PCBs can be provided. The PCBs can include a plurality of pads arranged in rows to receive tiles to a form segmented multipole. In various embodiments, the rows of conductive pads can be arranged in a straight line, an arc, a sigmoidal curve, or any combination thereof.

At 804, a mask can be used to apply solder paste to the pads. At 806, tiles can be positioned over the pads, such as by a pick-and-place machine. The pick-and-place machine can also place electrical components, such as resistors, on the PCB.

In various embodiments, each row can contain at least 2, at least 3, at least 5, at least 10, at least 15, even at least 20 pads, such that the segmented rod will contain at least 2, at least 3, at least 5, at least 10, at least 15, even at least 20 rod tiles.

In various embodiments, rod tiles can include a conductive metal substantially free of non-conductive oxides. The conductive metal can include stainless steel, titanium, nickel, or any combination thereof.

In various embodiments, rod tiles can include a core of deformable material and a surface layer of conductive material. The deformable material can be an extrudable material such as a polymer, a deformable metal, such as copper, brass, or aluminum, or a combination thereof. The conductive material can include a metal substantially free of non-conductive oxides, such as gold or nickel. Rod tile cores can be formed by cutting the core from an extrusion, by stamping the core, or any combination thereof. The cores can then be plated with a surface layer of conductive material.

At 808, the solder can be reflowed to provide mechanical and electrical connections between the tiles and the pads on the PCBs, as well as between the PCB and any electrical components. During the reflow, the tiles can self-align as they float on the molten solder and center themselves on the pads. At 810, two or more PCBs can be aligned with one another to form the ion guide.

While the present teachings are described in conjunction with various embodiments, it is not intended that the present teachings be limited to such embodiments. On the contrary, the present teachings encompass various alternatives, modifications, and equivalents, as will be appreciated by those of skill in the art.

Further, in describing various embodiments, the specification may have presented a method and/or process as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process should not be limited to the performance of their steps in the order written, and one skilled in the art can readily appreciate that the sequences may be varied and still remain within the spirit and scope of the various embodiments.

What is claimed is:

1. An radio frequency multipole assembly comprising:
    first and second printed circuit boards, each printed circuit board comprising:
        a substrate;
        at least two rows of conductive pads; and a plurality of tiles affixed to the conductive pads to form at least two radio frequency rods of a radio frequency multipole;

wherein the first and second printed circuit boards are arranged with the radio frequency rods towards each other and aligned to for the radio frequency multipole.

2. The radio frequency multipole assembly of claim 1 wherein the radio frequency multipole is an ion guide, a quadrupole mass filter, a collision cell, or an ion trap.

3. The radio frequency multipole assembly of claim 1 wherein each of the rows of conductive pads are arranged in a straight line, an arc, a sigmoidal curve, or any combination thereof.

4. The radio frequency multipole assembly of claim 1 wherein the tiles include a conductive metal substantially free of non-conductive oxides.

5. The radio frequency multipole assembly of claim 4 wherein the metal includes stainless steel, titanium, nickel, or any combination thereof.

6. The radio frequency multipole assembly of claim 1 wherein the tiles include a core of deformable material and a surface layer of conductive material.

7. The radio frequency multipole assembly of claim 6 wherein the tiles are formed by cutting the core from an extrusion, by stamping the core, or any combination thereof and plating the core with the surface layer of conductive material.

8. The radio frequency multipole assembly of claim 6 wherein the extrudable material includes a polymer, a deformable metal, or any combination thereof.

9. The radio frequency multipole assembly of claim 8 wherein the deformable metal includes copper, brass, or aluminum.

10. The radio frequency multipole assembly of claim 6 wherein the conductive material includes a metal substantially free of non-conductive oxides.

11. The radio frequency multipole assembly of claim 10 wherein the metal substantially free of non-conductive oxides includes gold or nickel.

12. The radio frequency multipole assembly of claim 1 wherein the tiles have a trapezoidal cross section, a rectangular cross section, a cross section with a curved edge, or any combination thereof.

13. The radio frequency multipole assembly of claim 12 wherein the curved edge includes a hyperbolic curved edge, a quadrant arc edge, or an arcuate curved edge.

14. The radio frequency multipole assembly of claim 1 wherein the tiles have a contact surface for contacting the conductive pad, the contact surface having a triangular shape or a quadrilateral shape.

15. The radio frequency multipole assembly of claim 14 wherein the quadrilateral shape includes a rectangular shape, a trapezoidal shape, or a parallelogram shape.

16. The radio frequency multipole assembly of claim 1 wherein the tiles substantially identical.

17. The radio frequency multipole assembly of claim 1 wherein each radio frequency rod includes at least 2 tiles.

18. The radio frequency multipole assembly of claim 17 wherein each radio frequency rod includes at least 5 tiles.

19. The radio frequency multipole assembly of claim 18 wherein each radio frequency rod includes at least 10 tiles.

20. The radio frequency multipole assembly of claim 19 wherein each radio frequency rod includes at least 20 tiles.

* * * * *